United States Patent [19]

Kitteridge et al.

[11] 4,126,468
[45] Nov. 21, 1978

[54] RADIATION SENSITIVE COMPOSITIONS OF QUATERNARY AMMONIUM SALT AND CARBOXYLIC ACID SENSITIZER

[75] Inventors: John M. Kitteridge; Robert J. Armstrong, both of, Leeds, England

[73] Assignee: Vickers Limited, London, England

[21] Appl. No.: 788,299

[22] Filed: Apr. 18, 1977

Related U.S. Application Data

[63] Continuation-in-part of Ser. No. 700,506, Jun. 28, 1976, abandoned.

[30] Foreign Application Priority Data

Jun. 24, 1976 [AU] Australia ............................... 15261/76
Jun. 28, 1976 [AU] Australia ............................... 4709/76

[51] Int. Cl.² ........................... G03C 1/00; G03F 7/02
[52] U.S. Cl. ............................................. 96/88; 96/33; 96/48 PD; 427/53; 427/54; 427/98; 427/304
[58] Field of Search ................... 96/33, 88, 36.4, 36.3, 96/48 PD; 427/43, 304, 437, 54, 98, 53

[56] References Cited

U.S. PATENT DOCUMENTS

| 3,316,093 | 8/1967 | Cerwonka et al. | 96/92 |
| 3,671,250 | 6/1972 | Andrews et al. | 96/88 |
| 3,954,471 | 5/1976 | Andrews et al. | 96/48 R |

Primary Examiner—Edward C. Kimlin

Attorney, Agent, or Firm—Reed, Smith, Shaw & McClay

[57] ABSTRACT

A radiation sensitive composition comprises a quaternary ammonium salt and a chemical sensitiser of the formula

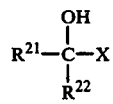

wherein $R^{21}$ is aryl, arylakenyl or arylalkyl, $R^{22}$ is aryl, alkyl, arylalkenyl, arylalkyl, carboxylic acid or salt, or hydrogen and X is carboxylic acid or salt. The quaternary ammonium salt is of the type which will accept at least one electron on exposure to radiation to form a substance capable of causing metal to be deposited onto said substance from an electroless plating solution in contact with said substance and comprising a salt of said metal and a reducing agent. A radiation sensitive plate comprises a metallic substrate coated with a radiation sensitive layer comprising a quaternary ammonium salt. The layer may be formed of the above composition. A lithographic printing plate is produced by image-wise exposing the plate, contacting the plate with an electroless plating solution and, if necessary, rendering the resultant image areas more oleophilic and the resultant non-image areas more hydrophilic.

19 Claims, No Drawings

RADIATION SENSITIVE COMPOSITIONS OF QUATERNARY AMMONIUM SALT AND CARBOXYLIC ACID SENSITIZER

This Application is a continuation-in-part application of our application No. 700,506 filed on the 28th June 1976 and now abandoned.

This invention relates to radiation sensitive plates and compositions and lithographic printing plates formed from the same.

According to one aspect of the present invention there is provided a radiation sensitive plate comprising a metallic substrate having a surface coated with a radiation sensitive layer based on a radiation sensitive composition comprising a quaternary ammonium salt of the type which accepts at least one electron on exposure to radiation to form a substance capable of causing metal to be deposited onto said substance from an electroless plating solution in contact with said substance and comprising a salt of said metal and a reducing agent.

In a preferred embodiment the radiation sensitive composition of the layer includes a chemical sensitiser for improving the speed of photoreduction of the salt. These sensitisers are compounds which contain active hydrogen and include alcohols, amines, phenols, carboxylic acids, and sugars. Examples of such sensitisers are glucose, oxalic acid, p-chlorobenzoic acids, glycerol, mellitic acid, triethanolamine, thiazine, phenol, ethylene diaminetetracetic acid (disodium salt), picric acid, glycine, β-alanine, and nicotinamide adenosine dinucleotide phosphate. It is particularly preferred for the chemical sensitizer to be of the type present in the novel radiation sensitive compositions which form a further aspect of the present invention.

According to this further aspect, there is provided a radiation sensitive composition comprising (i) a quaternary ammonium salt of the type which will accept at least one electron on exposure to radiation to form a substance capable of causing metal to be deposited onto said substance from an electroless plating solution in contact with said substance and comprising a salt of said metal and a reducing agent and (ii) a chemical sensitiser for improving the speed of photoreduction of the salt said sensitizer having the general formula

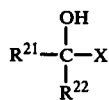

wherein $R^{21}$ is a substituted or unsubstituted aryl group, an aryl alkenyl group, or an arylalkyl group; $R^{22}$ is a substituted or unsubstituted aryl group, an alkyl group, an arylalkyl group, an arylalkenyl group, a carboxylic acid group, a carboxylic acid salt group, or a hydrogen atom; or $R^{21}$ and $R^{22}$ together represent a bivalent species; and X represents a carboxylic acid group or a carboxylic acid salt group.

The quaternary ammonium salt may be of the type described in British Patent specification No. 1,310,812 and having the general formula:

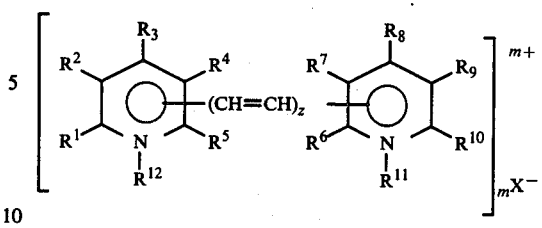

wherein $R^1$ to $R^{10}$ are hydrogen or halogen atoms or organic substituents; $R^{11}$ and $R^{12}$, if present, are each halogen atoms or organic substituents or together represent a divalent organic substituent; Z is zero or an integer; $X^-$ is an anion; m = 1 or 2; and at least one of the nitrogen atoms is quaternary. In an embodiment, $R^{11}$ and $R^{12}$ are not each —CH$_3$ groups or are not together a —CH$_2$—CH$_2$— group when each of $R^1$ to $R^{10}$ is a hydrogen atom and Z is zero.

The quaternary ammonium salt is preferably a diquaternary cyclic ammonium salt which by the addition of one electron forms Weitz radicals. Such salts are dicationic and contain nitrogen atoms in the molecule, at least two of the nitrogen atoms being quaternised and being constituents of ring structures which are linked and are at least partially aromatic, the link between the ring structures providing a chain of conjugated unsaturation between the nitrogen atoms. Particularly suitable diquaternary ammonium salts for the compositions of the present invention are the bipyridylium salts exemplified by

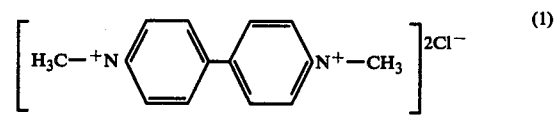

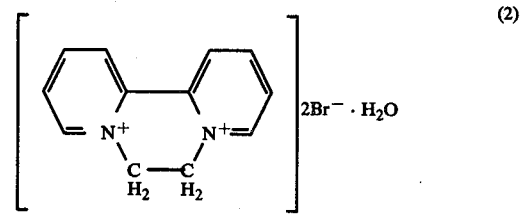

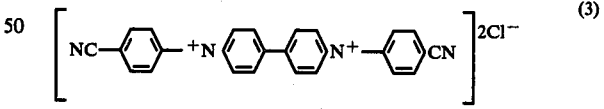

Compounds (1) and (2) are commercially available materials marketed under the trade names of PARAQUAT and DIQUAT respectively. Compound (3) is N,N'-bis-(paracyanophenyl)-4,4' bipyridylium dichloride and will hereinafter be referred to as CPP++.

Preferably the quaternary ammonium salt is colourless or only slightly coloured prior to exposure and the substance formed therefrom on exposure is coloured, so that a readily visible image is produced on exposure. For example, the dication CPP++ is almost colourless, the radical cation formed by the addition of one electron to the dication CPP++ green, and the corresponding neutral molecule formed by the addition of two electrons to the dication CPP++ is red.

The quaternary ammonium salt may include a simple cation or it may be part of a more complex molecule such as a dimeric cationic compound. It may be a polymeric material with one or more of the ring structures containing the quaternary nitrogens being in the polymer backbone, in end groups, in side chains or in combinations of such positions.

The anions of the quaternary ammonium salts may be, for example, halides, perchlorates, tetrafluoroborates, silicofluorides, methyl sulphates, bisulphates, or polymeric anions such as, for example, poly(acrylate). The presence of bromine and iodine atoms is less desirable than the presence of chlorine or fluorine atoms because bromine and iodine act as quenchers for the excited state of the cation. The anions should not be oxidising or reducing agents.

In an embodiment, in the formula for the chemical sensitiser, $R^{21}$ is not a phenyl group when $R^{22}$ is a phenyl group. Examples of suitable chemical sensitizers of the specified formula are mandelic acid, p-bromo-mandelic acid, p-chloromandelic acid, p-fluoromandelic acid, m-methoxymandelic acid, o-methoxymandelic acid, p-methoxymandelic acid, m-nitromandelic acid, benzilic acid, 3-phenyllactic acid, atrolactic acid, 9-hydroxy-fluorene-9-carboxylic acid, 3,4-dimethoxy 2'-chlorobenzilic acid, di-p-methoxybenzilic acid, 1-naphthyl glycollic acid and styryl glycollic acid. It is particularly preferred to use water soluble sensitisers such as sodium mandelate, ammonium mandelate, tetramethyl ammonium p-fluoro mandelate, potassium atrolactate and hexamethylene tetramine mandelate. The chemical sensitisers appear to act as electron donors in the photoreduction action. The molar ratio of quaternary ammonium salt to chemical sensitiser may be, for example, from 10:1 to 1:50 respectively.

The inherent spectral sensitivity of the quaternary ammonium salts can be extended well into the visible region of the spectrum by the inclusion of spectral sensitisers and such sensitisers may be included in the composition of the present invention. Suitable spectral sensitisers are riboflavin, 7-chloro-9-(N-methyl-2-diethylaminoethyl) isolloxamine chloride (hereinafter referred to as compound RD) and other very similar compounds, and Arconol Yellow (3,6-dimethyl-2-(4-dimethylamino-phenyl) benzthiazolium chloride). Other sensitisers which can be used include 3,3'-diethylthiacyanine iodide, proflavin, acridine orange, acriflavin, N-methylphenazinium methosulphate, 4-cyanoquinolinium methiodide and erythrosin.

The composition of the present invention may additionally include a film-forming polymeric binder. The binder may be such that it is inert towards the substance formed on exposure of the quaternary salt or such that it has a stabilising influence on that substance. Suitable water soluble or swellable film forming polymers for use as the binder include poly(vinyl alcohol), poly(ammonium methacrylate), gelatin, alginates and maleic anhydride copolymers e.g. a copolymer of maleic anhydride with styrene vinyl ether or ethylene. Soluble polysaccharides such as polysucrose may also be used as binder as may poly-(N-vinylpyrrolidone) either alone or in admixture with poly(vinylalcohol). Poly(vinylalcohols) of many viscosities and degrees of hydrolysis may be used but low-and medium-viscosity and maximum degree of hydrolysis grades are preferred. The relative amounts (in parts by weight) of quaternary salt to binder may be, for example, from 1:200 respectively to 10:1 respectively.

Other materials may be present in the composition as required. For example surface active agents may be included. Other compounds may also be present in the composition such as ethylene diamine-tetracetic acid (disodium salt), diammonium hydrogen citrate, ammonium chloride, and the fumed silica known under the Trade Mark Cab-o-sil.

The composition of the present invention can be used as an image-forming system of general application for forming high contrast positives from negatives and vice-versa. The composition may be reduced in an image-wise manner by means of actinic light, by means of an electron beam or a laser beam or by means of a spark cutting machine. The composition may be applied to a suitable substrate, e.g. of metal or plastics material, to form a radiation sensitive plate which, after image-wise reduction may be contacted with an electroless plating solution, for example a solution containing a silver salt and a reducing agent, to form an image as a result of deposition of metal from the electroless plating solution onto the reduced areas of the composition. Such solutions are well known per se and are capable of depositing metal without the external application of an electrical field.

In the case where the radiation sensitive plate of the present invention includes a metallic substrate, it can be used in the manufacture of a lithographic printing plate. Accordingly, another aspect of the present invention provides a method of manufacturing a lithographic printing plate which comprises (i) image-wise exposing to radiation a radiation sensitive plate comprising a metallic substrate having a surface coated with a radiation sensitive layer comprising a quaternary ammonium salt of the type which will accept at least one electron on exposure to radiation to form a substance capable of causing metal to be deposited on to said substance from an electroless plating solution in contact with said substrate and comprising a salt of said metal and a reducing agent, and (ii) contacting the image-wise exposed plate with an electroless plating solution comprising a metal salt and a reducing agent to cause deposition of metal onto the radiation-struck areas of the layer to form the desired lithographic printing plate.

The substrate used should either be intrinsically inert to the radiation sensitive layer or be capable of being passivated so that it is inert to the layer. The substrate may be of aluminum. The preferred substrate is formed of high purity aluminium containing not less than 99.0% aluminum and advantangeously containing from 99.3% to 99.7% aluminium.

Preferably, that surface of the substrate which is to be coated with the radiation sensitive layer is preferably roughened to promote adhesion of the layer and the printing image obtained after processing. The surface roughening or grain also eases considerably the task of the press operator in maintaining the correct ink-water balance during printing.

The grained surfaces may be achieved in many ways that are known to those skilled in the arts of producing suitably treated substrates for lithographic printing plates. The treatment may be mechanical by the action of rotating brushes, by sand blasting, or by ball graining. The rough surface can also be obtained by simple etching with a variety of chemicals which attack the metal. However, the preferred method of graining the surface is electrochemical. This is achieved by immersing the metal in sheet form (batch process) or in coil form (continuous process) in a bath of suitable acid or mixture of acids and an alternating current is passed between the metal and for example, graphite electrodes. The acid in the case of aluminium may be for example hydrochloric acid or nitric acid. Preferably the substrate is provided with a fine grain.

After graining, the substrate should be desmutted to remove the products of the graining process from the surface which could react with the radiation sensitive layer. The desmutting step may be performed in known manner by passing the grained metal through one or more baths containing a variety of possible acids and/or alkalis.

It is also advantageous for the substrate surface to be anodised. The anodic layer, when of sufficient thickness, prevents the radiation sensitive layer from chemically reacting with the metal and also increases markedly the number of copies that can be obtained from the final printing plate under a fixed set of conditions on a printing press. The anodising may be performed using a variety of electrolytes known to those skilled in the arts of anodising metals such as aluminium for lithographic printing plate production. A sulphuric acid electrolyte is preferred.

The radiation sensitive plate is prepared by applying to the substrate, preferably of grained and anodised aluminium, a coating solution comprising the radiation sensitive composition (e.g. including the quaternary ammonium salt and optionally, chemical sensitiser, the binder material and any other desired additives). The amounts of quaternary ammonium salt and binder (if present) in the coating solution are not critical and are dictated solely by the desired sensitivity and by practical considerations. Adequate results may be obtained using a coating solution containing from 0 to 20 parts by weight of water soluble polymeric binder, from 0.1 to 10 parts by weight of quaternary ammonium salt, and from 70 to 99.9 parts by weight of water. It is preferred to use a coating solution having a pH of from about 1 to 7. In general the higher the pH the more sensitive is the composition. The coating solution may be applied to the substrate in a variety of ways but dip or roller coating are the preferred methods.

In use of the radiation sensitive plate of the present invention in the photomechanical production of a lithographic printing plate, the radiation sensitive layer is image-wise exposed to actinic radiation e.g. ultra violet light. The quaternary ammonium salt accepts at least one electron in the areas struck by radiation to form an image which is a negative of the master. For example, in the case where the quaternary ammonium salt is a dication (the normally stable state in aqueous media) represented by $Q^{++}$ the following reaction occurs under the influence of the radiation:

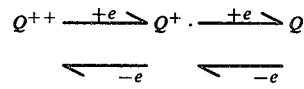

The image consists of the radical cation $Q^{+\cdot}$ or the neutral molecule $Q$ either of which are able to cause metal to be deposited from electroless plating solutions.

The image-wise exposed plate does not have to be processed immediately. Although the image decays in the presence of moisture and oxygen, the exposed plate is sufficiently stable to be handled in normal conditions for, for example, step and repeat work. If however, it is desired to store the image-wise exposed plate for any length of time, then it is best to do so under dry and/or oxygen free conditions.

The image-wise exposed plate is processed by contacting the same with an electroless plating solution, for example a solution containing a silver salt and a reducing agent. Such solutions are well known per se and are capable of depositing metal without the external application of an electrical field.

An adherent metallic image is thus deposited on the radiation struck areas of the layer. Once a trace of metal has been so deposited, it is capable of catalysing further deposition of the same or a different metal from an appropriate solution. In this way a metallic layer can be built up in the image areas. The amount of metal deposited depends upon many variables such as the composition of the radiation sensitive layer, exposure time, time of contact with the electroless plating solution, and composition of the electroless plating solution. In the case of silver images, image weights of up to 25 g per square meter and even higher can be obtained. Further treatment can then be carried out as necessary to render the metallic image more oleophilic and the non-image areas more hydrophilic. The plate may be inked in if so desired and then treated in the usual manner with gum solution before mounting on the printing press. The resultant plate may be used on a sheet fed press to print long runs of the highest quality and may also be used to print long runs on a web-offset printing press. The plate is also suitable for direct litho applications.

It is possible to prepare radiation sensitive plates in accordance with the present invention which have the properties of high resolution and acutance and which are suitable for use in the production of lithographic printing plates having the ability to withstand the most arduous of printing conditions in the manner of bimetallic lithographic printing plates.

The following Examples illustrate the invention. In all cases except where otherwise stated, the quantities of the various ingredients used are expressed in parts by weight. The amount of radiation sensitive coating material applied in the Examples was of the order of 0.2g per sq. metre. The silver electroless plating solution used in Examples 1 to 16 was prepared by admixing 100 ml of solution I, 25 ml of solution II and 25 ml of solution III, as follows:

| Solution I | | |
|---|---|---|
| Ferous ammonium sulphate | 100 | g |
|  | 10 | g |
| Ferric nitrate | 10 | g |
| citric acid | 100 | g |
| Water to | 1 | liter |

| Solution II | | |
|---|---|---|
| Dodecylamine | 0.5 | g |
| Synthrapol N | 0.5 | g |
| Acetic acid | 0.5 | g |
| Water to | 1 | liter |

| Solution III | | |
|---|---|---|
| Silver Nitrate | 25 | g |
| Water to | 1 | liter |

Synthrapol N is a non-ionic wetting agent and is an ethylene oxide condensate with an aliphatic alcohol.

EXAMPLE 1

The following coating solution was prepared and roller coated onto a sheet of aluminium which had been grained in nitric acid, desmutted in phosphoric acid and finally anodised in sulphuric acid.

| | |
|---|---|
| CPP+ (N,N′-di(p-cyanophenyl)-4,4′-bipyridylium dichloride) | 1.0 |
| Lemol 16–98 | 5.0 |
| Riboflavin | 0.5 |
| Citric acid $H_2O$ | 1.3 |
| Sodium hydroxide | 0.5 |
| Water | 95.0 |

Lemol 16–98 is a poly(vinyl alcohol) of the Borden Chemical Company.

The resultant radiation sensitive plate was exposed through a negative transparency in a printing down frame for 1.5 minutes to the radiation from four Philips 300w MLU lamps suspended 600mm above the frame. A green print-out image was obtained. The exposed plate was then immersed in the silver electroless plating solution for 3 minutes at room temperature. The green image was replaced by a black image of silver metal which could be polished to obtain lustrous silver which was in conductive contact with the aluminium substrate.

EXAMPLE 2

The following coating solution was prepared and used to produce a radiation sensitive plate in exactly the same way as in Example 1 except that the exposure time was 4 minutes.

| | |
|---|---|
| CPP++ | 2.0 |
| Lemol 16–98 | 5.0 |
| Water | 95.0 |
| Synthrapol N | 0.02 |
| RD | 1.0 |
| Ammonium oxalate, $H_2O$ | 2.0 |

The plate was exposed and processed as in Example 1 except that the exposure time was four minutes. The print-out image was green as in Example 1.

EXAMPLE 3

The following coating solution was prepared and used to form a radiation sensitive plate as in Example 1:

| | |
|---|---|
| CPP++ | 1.0 |
| Lemol 16–98 | 5.0 |
| Water | 95.0 |
| Synthrapol N | 0.02 |
| RD | 0.5 |
| EDTA | 1.0 |

The plate was exposed as in Example 1 except that the exposure time was one minute.

The green print out image of the exposed plate was replaced by a black image of metallic silver after the plate had been immersed in the silver plating solution for three minutes at room temperature. The plate surface was then swabbed over with a pad of cotton wool soaked in a dispersion of an organic mercapto compound and wetting agent in water to increase the initial ink-receptivity of the image. After inking and gumming in the normal manner the plate was placed on a sheet-fed, offset, printing press and several hundred good, clean copies were run off.

EXAMPLE 4

Example 1 was repeated using the following coating solution and an exposure time of four minutes:

| | |
|---|---|
| CPP++ | 2.0 |
| Lemol 16–98 | 2.5 |
| Moly(vinylpyrrolidone) Mol.Wt.700,000 | 2.5 |
| Water | 95.5 |

EXAMPLE 5

Example 1 was repeated using the following coating solution and an exposure time of 10 minutes:

| | |
|---|---|
| CPP++ | 1.0 |
| RD | 0.5 |
| EDTA (disodium salt) | 1.0 |
| Synthrapol N | 0.02 |
| Cyanamer P26 | 3.0 |
| Water | 97.0 |

Cyanamer P26 is a copolymer of acrylamide, acrylic acid, and sodium acrylate obtainable from Cyanamid of Great Britain Limited.

EXAMPLE 6

The following coating solution was prepared and roller coated onto a fine grained and anodised aluminium sheet.

| | |
|---|---|
| Benzyl Viologen | 1.0 |
| Lemol 16–98 | 1.0 |
| Water | 69.0 |
| RD | 0.5 |
| Benzilic acid | 2.0 |
| Dimethylformamide | 30.0 |

Benzyl viologen is similar to paraguat but with the methyl groups replaced by benzyl groups.

The resultant plate was image wise exposed as in Example 1 for 2 minutes. A pale purple, print-out image was obtained. On treatment with the silver plating solution sufficient silver could not be deposited to give a polishable silver image.

EXAMPLE 7

The following coating solution was prepared and coated onto a fine grained and anodised aluminium substrate:

| | |
|---|---|
| Paraquat | 1.0 |
| Lemol 16–98 | 5.0 |
| Water | 95.0 |
| BRIJ 35 | 0.1 |
| RD | 0.5 |
| EDTA | 2.0 |
| Benzilic acid | 1.2 |
| Sodium hydroxide to pH4 | |

BRIJ 35 is a non-ionic wetting agent and is an ethylene oxide condensate of an aliphatic alcohol.

The resultant radiation sensitive plate was image-wise exposed as in Example 1 for three minutes. A purple print-out image was obtained.

EXAMPLE 8

Example 7 was repeated using Diquat instead of Paraquat. A pale blue print out image was obtained.

EXAMPLE 9

Example 1 was repeated using the following coating solution and an exposure time of two minutes.

| | |
|---|---|
| CPP++ | 1.0 |
| RD | 0.5 |
| Ammonium chloride | 0.57 |
| Mandelic acid | 1.0 |
| Ammonium mandelate | 1.0 |
| BRIJ 35 | 0.1 |
| Gelatine | 2.0 |
| Water | 98.0 |

A green print-out image was obtained.

EXAMPLE 10

Example 3 was repeated using the following coating solution and an exposure time of 2 minutes:

| | |
|---|---|
| CPP++ | 1.0 |
| RD | 0.5 |
| Ammonium chloride | 0.6 |
| Mandelic Acid | 2.0 |
| BRIJ 35 | 0.1 |
| Lemol 16–98 | 5.0 |
| Water | 95.0 |

Good, clean, high quality prints were obtained.

EXAMPLE 11

Example 3 was repeated using the following coating solution and an exposure time of 30 seconds:

| | |
|---|---|
| CPP++ | 1.0 |
| Lemol 16–98 | 3.0 |
| Water | 67.0 |
| RD | 0.5 |
| Benzilic acid | 2.0 |
| DMF | 30.0 |

Good clean high quality prints were obtained.

EXAMPLE 12

Example 3 was repeated using the following coating solution and an exposure time of 15 seconds:

| | |
|---|---|
| CPP++ | 1.0 |
| RD | 0.5 |
| Ammonium chloride | 0.6 |
| Mandelic acid | 2.0 |
| Sodium bicarbonate | 0.5 |
| BRIJ 35 | 0.1 |
| Cab-o-sil M5 | 0.5 |
| Lemol 16–98 | 4.6 |
| Water | 95.0 |

EXAMPLE 13

Example 1 was repeated using the following coating solution and an exposure time of two minutes:

| | |
|---|---|
| CPP++ | 1.0 |
| RD | 0.5 |
| Ammonium chloride | 0.57 |
| p-bromo-mandelic acid | 2.0 |
| BRIJ 35 | 0.1 |
| Gelatine | 2.0 |
| Water | 68.0 |
| DMF | 30.0 |

Good, clean, high quality prints were obtained.

EXAMPLE 14

Example 1 was repeated using the following coating solution and an exposure time of two minutes:

| | |
|---|---|
| CPP++ | 1.0 |
| Lemol 16–98 | 3.0 |
| RD | 0.5 |
| α-methoxyphenyl acetic acid | 2.0 |
| DMF | 30.0 |
| Water | 67.0 |

Good, clean high quality prints were obtained.

EXAMPLE 15

Example 7 was repeated using the following coating solution and an exposure time of two minutes:

| | |
|---|---|
| Paraquat | 1.0 |
| Lemol 16–98 | 5.0 |
| BRIJ 35 | 0.1 |
| RD | 0.5 |
| p-chloromandelic acid | 2.0 |
| Water | 95.0 |
| Sodium hydroxide to pH4 | |

A purple print-out image was obtained.

EXAMPLE 16

Example 15 was repeated using 2.0 of α-naphthyl glycollic acid in place of the p-chloromandelic acid. A purple print-out image was obtained.

In the following Examples 17 to 30, the silver electroless plating solution used was prepared by admixing 1 part of solution II and 4 parts of solution I followed by the addition of 1 part of solution III, the solutions being, as follows:

Solution I

| | |
|---|---|
| Ferous ammonium sulphate | 100g |
| Ferric nitrate | 40g |
| Citric acid | 100g |
| water to | 1 liter |

Solution II

| | |
|---|---|
| n-Dodecylamine | 1.6g |
| Lissapol N | 0.97g |
| Acetic acid | 2.4g |
| Oleylamine | 0.8g |
| Water to | 1 liter |

Solution III

| | |
|---|---|
| Silver Nitrate | 120g |
| Water to | 1 liter |

Lissapol N is a non-ionic wetting agent and is an ethylene oxide condensate with a nonyl phenolic alcohol.

EXAMPLE 17

A composition was prepared comprising the following ingredients:

| | |
|---|---|
| CPP++ | 1.50 (0.0035 moles) |
| Triton X-100 | 0.10 |
| Lemol 16-98 | 3.00 |
| Dimethylformamide | 30.00 |
| Water | 70.00 |

Triton X-100 is octylphenoxypolyethoxyethanol. Lemol 16-98 is a poly(vinylalcohol) produced by the Borden Chemical Company.

The composition was applied by roller coating to a sheet of aluminium which had been electro-grained in nitric acid, desmutted in phosphoric acid and finally anodised in sulphuric acid to form a radiation sensitive plate having a dry coating weight of from about 0.1 to 0.2 g/m².

Using a Kodak No. 2 step-wedge and a contact printing frame, the radiation sensitive plate was exposed for 2 minutes to the radiation from four Phillips 300 W MLU lamps 600 mm from the frame. The resultant print out image was then examined and its reflected optical density was measured through a red filter. Then the plate was immersed in the above silver electroless plating solution for 3 minutes at room temperature.

Further identical aluminium sheets were coated as above except that the composition contained 3.0 parts of various chemical sensitisers. The resulting plates were then exposed, examined, developed, and measured as above. The results are shown in Table 1.

The above experiments were then repeated using an exposure time of 30 seconds instead of 2 minutes. The results are shown in Table 1.

TABLE 1

| CHEMICAL SENSITISER and amount of same in moles | COATING SOLUTION pH. | NUMBER OF SOLID STEPS ON DEVELOPED PLATE (AFTER 2 MINUTES EXPOSURE) | INCREASED IN REFLECTED OPTICAL DENSITY. | |
|---|---|---|---|---|
| | | | AFTER 30 SECONDS EXPOSURE | AFTER 2 MINUTES EXPOSURE |
| Mandelic acid (0.020) | 3.2 | 7 | 0.15 | 0.24 |
| Hexamethylenetetramine Mandelate (0.010) | 4.8 | 2 | 0.27 | 0.25 |
| p-Methoxymandelic acid (0.016) | 3.0 | 4 | 0.20 | 0.32 |
| o-Methoxymandelic acid (0.016) | 3.2 | 3 | 0.22 | 0.24 |
| Atrolactic acid (0.018) | 3.0 | 1 | 0.27 | 0.27 |
| 3-Phenyllactic acid (0.018) | 3.1 | 1 | 0.12 | 0.25 |
| 9-Hydroxyfluorene-9-carboxylic acid (0.013) | 1.9 | 6 | 0.15 | 0.16 |
| Benzilic acid (0.013) | 3.0 | 5 | 0.28 | 0.23 |
| p-fluoromandelic acid (0.018) | 3.2 | 7 | 0.14 | 0.24 |
| None | 6.0 | None | 0.01 | 0.01 |

The dimethyl formamide (DMF) was included because some of the sensitisers had low solubility in water.

Any decrease in image density with increase of exposure time was due to the formation of a red colour in the image areas.

EXAMPLE 18

To test the effect of using different amounts of mandelic acid, p-fluoro mandelic acid, and benzilic acid as sensitiser, the procedure of Example 17 was repeated using CPP++ and sensitiser as shown in Table 2.

TABLE 2

| Sensitiser | | Mandelic acid | | | | p-fluoro mandelic acid | | | | benzilic acid | | | |
|---|---|---|---|---|---|---|---|---|---|---|---|---|---|
| Amount of Sensitiser | part by weight moles | 0.5 0.0035 | 1.0 0.0066 | 1.5 0.0099 | 3.0 0.020 | 0.5 0.0029 | 1.0 0.0059 | 1.5 0.0088 | 3.0 0.018 | 0.5 0.0022 | 1.0 0.0043 | 1.5 0.0067 | 3.0 0.013 |
| Highest Stepwedge number appearing after exposure | | 13 | 14 | 15 | 16 | 13 | 13 | 16 | 16 | 16 | 16 | 16 | 16 |
| Immersion time (seconds) before silver image first appears | | 15 | 10 | 5 | 3 | 10 | 4 | 3 | 3 | 25 | 20 | 10 | 8 |
| Highest step wedge number which is solid silver | | 3 | 4 | 5 | 7 | 3 | 5 | 6 | 7 | 2 | 3 | 4 | 5 |

EXAMPLE 19

A composition was prepared comprising the following ingredients:

| | | |
|---|---|---|
| CPP++ | 1.5 | (0.0035 moles) |
| Triton X-100 | 0.10 | |
| Lemol 16-98 | 3.00 | |
| Water | 97.00 | |
| Mandelic acid | 1.5 | (0.0099 moles) |

The composition was applied by a two roll roller coater to a sheet of aluminium as in Example 17 to give a dry coating weight of about 0.2 g/m².

The resulting radiation sensitive plate was exposed through a negative transparency as in Example 1. The exposed plate was then immersed in the silver electroless plating solution for 3 minutes at room temperature. The plating surface was then washed with water and then swabbed over with a pad of cotton wool soaked in a dispersion of an organic mercapto compound and wetting agent in water to increase the initial ink receptivity of the image. After inking and gumming in the normal manner the plate was placed on a sheet-fed, offset printing press. A run of 500,000 high quality prints was obtained.

EXAMPLE 20

Example 19 was repeated using a composition comprising:

| | | |
|---|---|---|
| CPP++ | 1.5 | (0.0035 moles) |
| BRIJ 35 | 0.10 | |
| Lemol 16–98 | 3.00 | |
| RD | 0.50 | |
| p-fluoromandeic acid | 1.5 | (0.0088 moles) |
| water | 97 | |

BRIJ 35 is a non-ionic wetting agent and is an ethylene oxide condensate of an aliphatic alcohol.

A satisfactory printing plate was obtained.

EXAMPLE 21

Example 19 was repeated using a composition comprising

| | | |
|---|---|---|
| CPP++ | 2.50 | (0.0058 moles) |
| BRIJ 35 | 0.10 | |
| Gelatin | 2.00 | |
| 9-hydroxyfluorene-9-carboxylic acid | 2.00 | (0.0087 moles) |
| Riboflavin | 0.50 | |
| Dimethyl formamide | 30.00 | |
| Water | 70.00 | |

A satisfactory printing plate was obtained.

EXAMPLE 22

A composition was prepared comprising the following ingredients:

| | | |
|---|---|---|
| CPP++ | 2.50 | (0.0058 moles) |
| Lemol 16–98 | 3.00 | |
| RD | 0.50 | |
| benzilic acid | 2.00 | (0.0087 moles) |
| Dimethyl-formamide | 30.00 | |
| Water | 67.00 | |

The composition was applied, by roller coating to a sheet of aluminium, which had been electrograined in a mixture of nitric acid and acetic acid, desmutted in phosphoric acid and anodised in sulphuric acid, to give a dry coating weight of about 0.2 g/m$^2$.

The resulting radiation sensitive plate was exposed and further processed as in Example 19 and a satisfactory printing plate was obtained.

EXAMPLE 23

Example 22 was repeated using the following composition:

| | | |
|---|---|---|
| CPP++ | 1.5 | (0.0035 moles) |
| Kuraray Poval 105 | 6.0 | |
| Riboflavin | 0.5 | |
| p-methoxy mandelic acid | 3.0 | (0.016 moles) |
| Lissapol N | 0.1 | |
| water | 94 | |

Kuraray Poval 105 is a low molecular weight fully hydrolysed poly(vinyl alcohol) made by Kuraray Limited. A similar result was obtained.

EXAMPLE 24

Example 22 was repeated using the following composition

| | | |
|---|---|---|
| CPP++ | 1.5 | (0.0035 moles) |
| Kuraray Poval 105 | 5.0 | |
| Ammonium mandelate | 1.5 | (0.0088 moles) |
| Triton X-100 | 0.10 | |
| EDTA (disodium salt) | 1.00 | |
| Water | 95.00 | |

A satisfactory printing plate was obtained.

EXAMPLE 25

A sheet of polyester film subbed with a layer of gelatin was roller coated with the composition of Example 19. After exposure for 2 minutes through a negative transparency a green image was obtained, which after 3 minutes immersion in silver electroless plating solution was replaced by a black image of silver metal which could be polished to obtain lustrous silver.

EXAMPLE 26

A composition was prepared comprising

| | | |
|---|---|---|
| CPP++ | 1.0 | (0.0023 moles) |
| RD | 0.5 | |
| Ammonium chloride | 0.57 | |
| Mandelic acid | 1.0 | (0.0066 Moles) |
| Ammonium mandelate | 1.0 | (0.0059 Moles) |
| BRIJ 35 | 0.1 | |
| Gelatine | 2.0 | |
| Water | 98.0 | |

The composition was roller coated onto a sheet of aluminium which had been grained in nitric acid, desmutted in phosphoric acid, and finally anodised in sulphuric acid. The resultant tradiation sensitive plate was exposed through a negative transparency in a printing down frame for 2 minutes to the radiation from four Philips 300w MLU lamps suspended 600 mm above the frame A green print-out image was obtained. The exposed plate was then immersed in the silver electroless plating solution for three minutes at room temperature. The green image was replaced by a black image of silver metal which could be polished to obtain lustrous silver which was in conductive contact with the aluminium substrate.

EXAMPLE 27

A composition was prepared comprising:

| | | |
|---|---|---|
| CPP++ | 1.0 | (0.0023 moles) |
| Lemol 16–98 | 3.0 | |
| Water | 67.0 | |
| RD | 0.5 | |
| Benzilic acid | 2.0 | (0.0086 moles) |
| DMF | 30.0 | |

The composition was used to form a radiation sensitive plate as in Example 28 and the plate was exposed as in Example 26 except that the exposure time was 30 seconds.

The green print out image of the exposed plate was replaced by a black image of metallic silver after the plate had been immersed in the silver plating solution for three minutes at room temperature. The plate surface was then washed with water and swabbed over with a pad of cotton wool soaked in a dispersion of an organic mercapto compound and wetting agent in water to increase the initial ink-receptivity of the image. After inking and gumming in the normal manner the plate was placed on a sheet-fed, offset, lithographic printing press and several hundred good, clean, high quality prints were run off.

EXAMPLE 28

A composition was prepared comprising

| | |
|---|---|
| CPP++ | 1.0 (0.0023 moles) |
| RD | 0.5 |
| Ammonium chloride | 0.6 |
| Mandelic acid | 2.0 (0.014 moles) |
| BRIJ 35 | 0.1 |
| Lemol 16–98 | 5.0 |
| Water | 95.0 |

The composition was used to form a radiation sensitive, plate as in Example 27 and the plate was exposed, processed, and used for printing as in Example 27 except that the exposure time was 2 minutes. Good clean, high quality prints were obtained.

EXAMPLE 29

A composition was prepared comprising:

| | |
|---|---|
| CPP++ | 1.0 (0.0023 moles) |
| RD | 0.5 |
| Ammonium chloride | 0.6 |
| Mandelic acid | 2.0 (0.014 moles) |
| Sodium bicarbonate | 0.5 |
| BRIJ 35 | 0.1 |
| Cab-o-sil M5 | 0.5 |
| Lemol 16–98 | 4.6 |
| Water | 95.0 |

The composition was used in a repeat of Example 27 but using an exposure time of 15 seconds.

EXAMPLE 30

A composition was prepared comprising:

| | |
|---|---|
| Benzyl Viologen | 1.0 |
| Lemol 16–98 | 1.0 |
| Water | 69.0 |
| RD | 0.5 |
| Benzilic acid | 2.0 |
| Dimethylformamide | 30.0 |

Benzyl viologen is similar to paraquat but with the methyl groups replaced by benzyl groups.

The composition was roller coated on to a fine grained and anodised aluminium sheet. The resultant plate was image wise exposed as in Example 26 for 2 minutes. A pale purple, print-out image was obtained.

As stated above, exposure to radiation in the presence of an electron donor causes $CPP^{++}$ to be reduced to the green radical cation $CPP^+$; the degree of colour change to green being a measure of the reduction. Thus, an indication of the effectiveness of materials as chemical sensitisers in acting as electron donors can be tested by measuring the reflected optical density of the green image resulting from an exposure of a composition containing $CPP^{++}$ and a chemical sensitiser.

The following method may be used for testing the effectiveness of a chemical sensitiser.

A solution of 0.0025M $CPP^{++}$, 0.01M sensitiser, 0.02M malonic acid and 10g/l of polyvinylbutyral in methanol is used. Methanol is used as it is the most suitable solvent for both $CPP^{++}$ and most sensitiser materials. The purpose of the malonic acid is to keep the pH of the solution approximately constant and the pupose of the polyvinylbutyral is to act as a binder and to reduce the rate of air oxidation of the radical cation $CPP^+$.

A piece of filter paper is dipped in the solution for 5 seconds, dried at 50° C. for 15 minutes and exposed for 30 seconds on an exposure frame. The reflected optical density of the resulting green image is then measured through a red filter 5 minutes after the exposure.

The results of this test for various sensitisers are shown in Table 3

TABLE 3

| Sensitiser | Optical Density | Sensitiser | Optical Density |
|---|---|---|---|
| mandelic acid | 0.87 | m-methoxy mandelic acid | 0.58 |
| benzilic acid | 0.81 | p-methoxy mandelic acid | 0.62 |
| p-bromomandelic acid | 0.80 | 3-phenyllactic acid | 0.58 |
| | | atrolactic acid | 0.79 |
| p-chloromandelic acid | 0.80 | p-fluoromandelic acid | 0.75 |
| 1-naphthylglycollic acid | 0.79 | 9-hydroxyfluorene-9-carboxylic acid | 0.70 |
| m-nitromandelic acid | 0.50 | 3,4-dimethoxy 2' chlorobenzilic acid | 0.52 |
| | | di-p-methoxy benzilic acid | 0.65 |
| o-methoxymandelic acid | 0.51 | styrylglycollic acid | 0.72 |

We claim:
1. A radiation sensitive composition comprising
   (i) a quaternary ammonium salt of the type which will accept at least one electron on exposure to radiation to form a substance capable of causing metal to be deposited onto said substance from an electroless plating solution in contact with said substance and comprising a salt of said metal and a reducing agent, said quaternary ammonium salt having the general formula

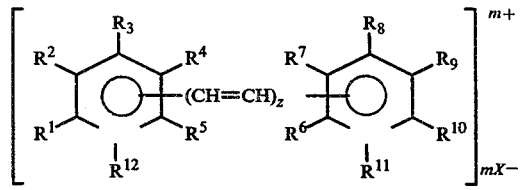

wherein $R^1$ to $R^{10}$ are hydrogen or halogen atoms or organic substituents; $R^{11}$ and $R^{12}$, if present, are each halogen atoms or organic substituents or together represent a divalent organic substituent; Z is zero or an integer; $X^-$ is an anion; m=1 or 2; and at least one of the nitrogen atoms is quaternary; provided that $R^{11}$ and $R^{12}$ are not each —$CH_3$ groups or are not together a —$CH_2CH_2$— group when each of $R^1$ to $R^{10}$ is a hydrogen atom and Z is zero, and
   (ii) a chemical sensitiser for improving the speed of photoreduction of the quaternary ammonium salt, said sensitiser having the general formula

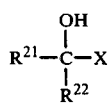

wherein $R^{21}$ is substituted or unsubstituted aryl group, an arylalkenyl group, or an arylalkyl group; $R^{22}$ is a substituted or unsubstituted aryl group, an alkyl group, an arylalkyl group, an arylalkenyl group, a carboxylic acid group, a carboxylic acid salt group, or a hydrogen atom; or $R^{21}$ and $R^{22}$ together represent a bivalent species; and X represents a carboxylic acid group or a carboxylic acid salt group.

2. A composition according to claim 1 wherein the quaternary ammonium salt is N,N'-bis-(paracyano phenyl)-,4,4'-bipyridylium salt.

3. A composition according to claim 1 in which the chemical sensitiser is mandelic acid.

4. A composition according to claim 1 in which the chemical sensitiser is a mandelic acid derivative.

5. A composition according to claim 4 in which the derivative is p-bromo mandelic acid or ammonium mandelate.

6. A composition according to claim 4 in which the derivative is p-chloro mandelic acid, p-fluoromandelic acid, m-methoxy mandelic acid, o-methoxy mandelic acid, p-methoxy mandelic acid, m-nitro mandelic acid, sodium mandelate, tetramethyl ammonium p-fluoro mandelate, or hexamethylene tetramine mandelate.

7. A composition according to claim 1 in which the chemical sensitiser is benzilic acid.

8. A composition according to claim 1 in which the chemical sensitiser is a derivative of benzilic acid.

9. A composition according to claim 8 wherein the derivative is 3,4-dimethoxy 2'-chloro benzilic acid or di-p-methoxy benzilic acid.

10. A composition according to claim 1 wherein the chemical sensitiser is 3-phenyl lactic acid, atrolactic acid, potassium atrolactate, 9-hydroxy fluorene -9-carboxylic acid, styryl glycollic acid, or 1-naphthyl glycollic acid 11. A radiation sensitive composition comprising (i) a quaternary ammonium salt of the type which will accept at least one electron on exposure to radiation to form a substance capable of causing metal to be deposited onto said substance from an electroless plating solution in contact with said substance and comprising a salt of said metal and reducing agent, said quaternary ammonium salt having the general formula:

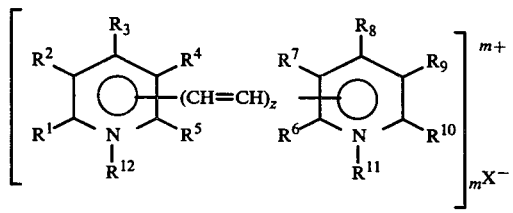

wherein $R^1$ to $R^{10}$ are hydrogen or halogen atoms or organic substitutents; $R^{11}$ and $R^{12}$, if present, are each halogen atoms or organic substituents or together represent a divalent organic substituent; Z is zero or an integer; $X^-$ is an anion; m=1 or 2; and at least one of the nitrogen atoms is quaternary, and (ii) a chemical sensitiser having the general formula

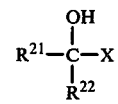

wherein $R^{21}$ is a substituted or unsubstituted aryl group, an arylalkenyl group or an aryl alkyl group; $R^{22}$ is a substituted or unsubstituted aryl group, an alkyl group, an aryl alkyl group, an aryl alkenyl group, a carboxylic acid group, a carboxylic acid salt group, or a hydrogen atom provided that $R^{21}$ is not a phenyl group when $R^{22}$ is a phenyl group; or $R^{21}$ and $R^{22}$ together represent a bivalent species; and X represents a carboxylic acid group, or a carboxylic acid salt group.

12. A composition according to claim 11 in which the chemical sensitiser is mandelic acid.

13. A composition according to claim 11 in which the chemical sensitiser is a mandelic acid derivative.

14. A composition according to claim 13 in which the derivative is p-bromo mandelic acid or ammonium mandelate.

15. A composition according to claim 13 in which the derivative is p-chloro mandelic acid, p-fluoromandelic acid, m-methoxy mandelic acid, o-methoxy mandelic acid, p-methoxy mandelic acid, m-nitro, mandelic acid, sodium mandelate, tetramethyl ammonium p-fluoromandelate or hexamethylene tetramine mandelate.

16. A composition according to claim 11 in which the sensitiser is 3,4-dimethoxy 2'-chloro benzilic acid or di-p-methoxy benzilic acid.

17. A composition according to claim 11 in which the chemical sensitiser is 3-phenyl lactic acid, atrolactic acid, potassium atrolactate, 9-hydroxy fluorene-9-carboxylic acid, styryl glycollic acid, or 1-naphthyl glycollic acid.

18. A composition according to claim 11 in which the quaternary ammonium salt has the general formula:

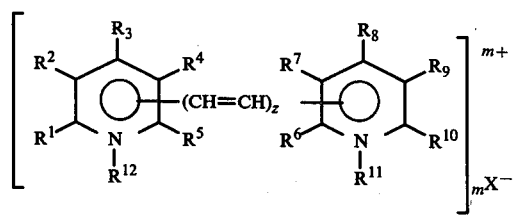

wherein $R^1$ to $R^{10}$ are hydrogen or halogen atoms or organic substituents; $R^{11}$ and $R^{12}$, if present, are each halogen atoms or organic substituents or together represent a divalent organic substituent; z is zero or an integer; $X^-$ is an anion; m=1 or 2; and at least one of the nitrogen atoms is quaternary.

19. A composition according to claim 18 wherein the quaternary ammonium salt is selected from the group consisting of paraquat, diquat, and an N,N'-bis-(paracyanophenyl)-4,4'-bipyridilium salt.

* * * * *

UNITED STATES PATENT AND TRADEMARK OFFICE
CERTIFICATE OF CORRECTION

PATENT NO. : 4,126,468
DATED : November 21, 1978
INVENTOR(S) : John M. Kitteridge et al.

It is certified that error appears in the above-identified patent and that said Letters Patent are hereby corrected as shown below:

On page one under the subtitle "Foreign Application Priority Data," delete:

"Jun. 24, 1976 [AU] Australia . . . 15261/76

"Jun. 28, 1976 [AU] Australia . . . 4709/76"

and substitute:

Jun. 28, 1975 Great Britain . . . . 27435/75

Signed and Sealed this

Twenty-ninth Day of July 1980

[SEAL]

Attest:

SIDNEY A. DIAMOND

Attesting Officer

Commissioner of Patents and Trademarks